(12) United States Patent
McGowan

(10) Patent No.: US 8,558,727 B2
(45) Date of Patent: Oct. 15, 2013

(54) COMPENSATED CURRENT CELL TO SCALE SWITCHING GLITCHES IN DIGITAL TO ANALOG CONVERTORS

(75) Inventor: Michael Joseph McGowan, Mesa, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 98 days.

(21) Appl. No.: 13/110,686

(22) Filed: May 18, 2011

(65) Prior Publication Data

US 2012/0293347 A1 Nov. 22, 2012

(51) Int. Cl.
*H03M 1/00* (2006.01)

(52) U.S. Cl.
USPC .......................................... 341/136; 341/144

(58) Field of Classification Search
USPC .................. 341/136, 144; 327/379, 382, 389
See application file for complete search history.

(56) References Cited

U.S. PATENT DOCUMENTS

| | | | |
|---|---|---|---|
| 5,218,570 A * | 6/1993 | Pascucci et al. ......... | 365/185.21 |
| 5,541,598 A * | 7/1996 | Malek-Khosravi .......... | 341/118 |
| 6,577,260 B2 | 6/2003 | Okada et al. | |
| 6,608,578 B2 * | 8/2003 | Lee et al. ...................... | 341/144 |
| 6,891,428 B1 * | 5/2005 | Zabroda et al. ............... | 327/543 |
| 6,903,671 B2 | 6/2005 | Kwon et al. | |
| 7,068,978 B2 * | 6/2006 | Sekiguchi ........................ | 455/74 |
| 7,071,858 B2 | 7/2006 | Pan | |
| 7,312,740 B2 | 12/2007 | Chou | |
| 7,317,357 B1 * | 1/2008 | Zou et al. ...................... | 330/254 |
| 7,782,236 B2 * | 8/2010 | Kim .............................. | 341/136 |
| 2006/0125670 A1 | 6/2006 | Cho et al. | |

FOREIGN PATENT DOCUMENTS

KR 20080083470 9/2008

OTHER PUBLICATIONS

International Search Report and Written Opinion—PCT/US2012/038714—ISA/EPO—Sep. 11, 2012.

* cited by examiner

*Primary Examiner* — Brian Young
(74) *Attorney, Agent, or Firm* — Ramin Mobarahan

(57) ABSTRACT

Compensated current cell to scale switching glitches in digital to analog convertors. A compensated current cell is disclosed that includes first and second switching transistors configured to switch an input current between first and second outputs based on first and second input signals, respectively, a first compensation transistor connected to the first input signal to provide a first compensation current that is connected to the second output, and a second compensation transistor connected to the second input signal to provide a second compensation current that is connected to the first output, the first and second compensation transistors having source terminals that are connected together. In another aspect, switching glitches are scaled based on a size difference between the switching transistors and the compensation transistors.

20 Claims, 4 Drawing Sheets

US 8,558,727 B2

COMPENSATED CURRENT CELL TO SCALE SWITCHING GLITCHES IN DIGITAL TO ANALOG CONVERTORS

BACKGROUND

1. Field

The present application relates generally to the operation and design of RF systems, and more particularly, to digital to analog convertors.

2. Background

Digital to analog convertors (DACs) are used in a variety of applications, such as in transmitters, to convert digital data into an analog signal for transmission. One type of DAC is referred to as a current steering DAC and operates to convert digital data into a corresponding current that can be used to generate an analog voltage signal representative of the digital data. For example, a current steering DAC switches current at its output based on a digital input so that adjacent current levels differs by an amount corresponding to a least significant bit (LSB). As a result, a 14-bit DAC can output up to 16,384 different current levels.

When a current steering DAC changes state, switching transients (or glitches) are generated which can degrade the DAC's performance. For example, glitches may cause inaccuracies during the conversion of the current output to an analog voltage. Since switching transients are unavoidable, it is desirable that they be identical to minimize their impact on DAC performance.

One way to have identical switching transients is to design the DAC (i.e., 14-bit DAC in this example) with 16,383 individual current sources that are selectively enabled based on the digital code to be converted. Although this solution may assure identical glitches, implementing such a large number of current sources is not very efficient. Another alternative would be to design the DAC with binary weighted current sources. Thus, for a 14-bit DAC, there will be fourteen individually controllable current sources that differ in weight by a factor of two from one source to the next. However, the problem with this solution is that binary weighted current sources can be difficult to produce so that the current matching requirements are accurately met. Additionally, binary weighted current sources will not be able to easily scale the glitches that they generate.

Therefore, it would be desirable to have a DAC that allows switching transients to be controlled so that they scale in the same manner as the switching currents and therefore do not degrade DAC performance.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
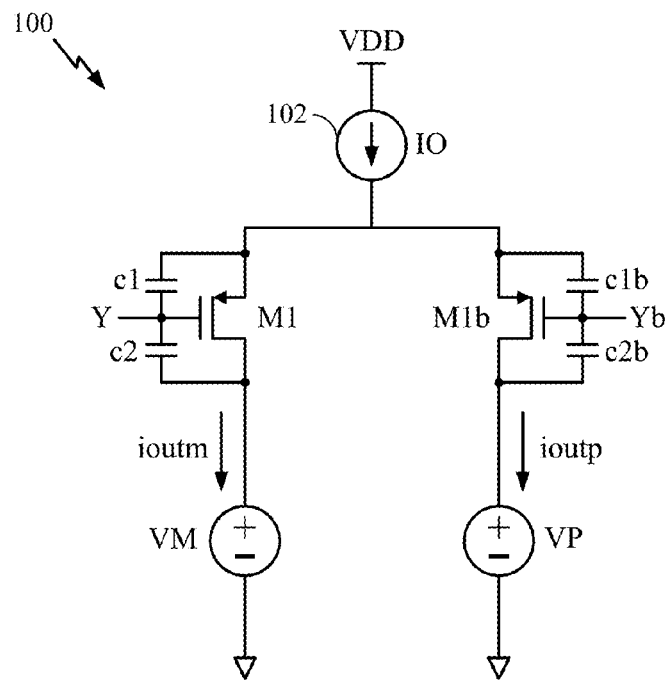
FIG. 1 shows a conventional uncompensated current cell for use in a current steering DAC.

FIG. 1 shows a conventional uncompensated current cell 100 for use in a current steering DAC. The current cell 100 comprises a differential PMOS transistor pair (M1, M1$b$) connected to receive current (I0) from a current source 102. Complementary signal inputs Y and Yb control the transistors M1 and M1$b$, respectively, to switch the current (I0) to generate complementary output currents ioutm and ioutp. VM and VP represent low impedance sources which receive the currents ioutm and ioutp. The currents ioutm and ioutp are converted to voltages elsewhere in the DAC circuit. The capacitors C1, C2, C1$b$ and C2$b$ are the parasitic capacitances associated with the devices M1 and M1$b$ and contribute to the glitches generated by the switching of the current cell 100.

During operation, the current cell 100 generates switching glitches that result from switching the differential transistor pair in response to the differential inputs Y and Yb. The resulting glitches have at least the following two sources.

1. clock feed-through
2. charge injection

Clock feed-through is the result of a clock signal (or in this case the differential inputs Y and Yb) capacitively coupling into the output. In the case of the DAC, the inputs Y and Yb of each current cell will couple into the shared outputs ioutm and ioutp through the parasitic capacitances associated with the differential switch. For example, the clock signal is configured to drive a DAC comprising a plurality of the current cells 100 to convert a digital input to a current output. Charge injection is the result of channel charge associated with the transistors (M1, M1$b$) coupling to the output current when the transistors change state. A more detailed description of how switching glitches are generated is provided below.

Figure 2:
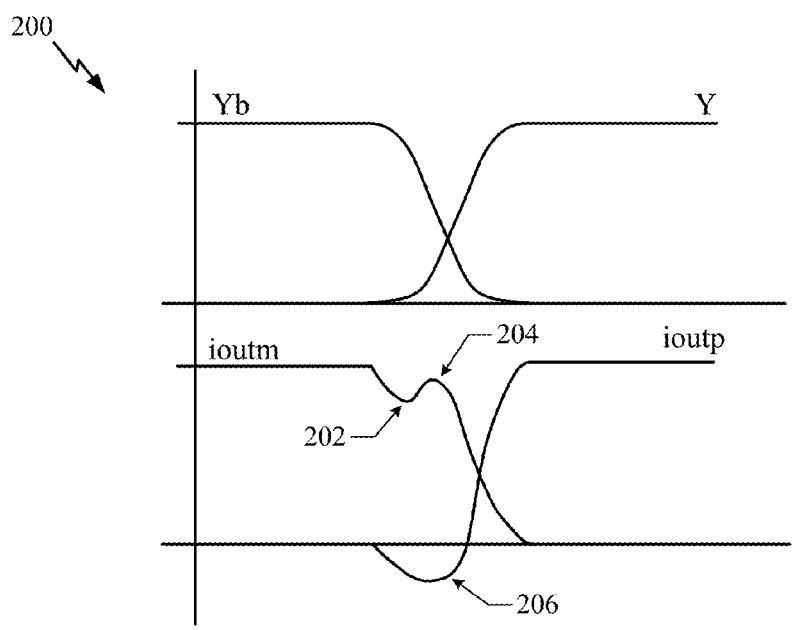
FIG. 2 shows a conventional graph illustrating glitches generated during operation of the current cell shown in FIG. 1.

FIG. 2 shows a conventional graph 200 illustrating glitches generated during operation of the uncompensated current cell 100 shown in FIG. 1. For example, the graph 200 shows a plot of the differential input signals Y and Yb that switch the differential pair M1 and M1$b$. A plot of the output currents ioutm and ioutp that result from the operation of the differential pair M1 and M1$b$ is also shown.

As the transistor M1 turns off and the transistor M1$b$ turns on in response to the inputs Y and Yb, the current I0 is switched from producing ioutm to producing ioutp. During this switch, glitches 202, 204 and 206 occur as shown in plot of the currents ioutm and ioutp. Glitch 202 is produced as a result of coupling from M1b "turn on" charge injection. Glitch 204 is produced when M1 turns off, and glitch 206 is produced when M1b turns on. The three glitches 202, 204, and 206 will combine to create a single composite glitch that may result in degraded DAC performance.

A novel compensated current cell is disclosed that operates to scale glitches in a current steering DAC. The compensated current cell comprises two compensation devices that generate compensation currents used to scale the glitches. In one exemplary DAC implementation, the compensated current cell is used to convert the least significant bits of a digital value, and as a result, switching glitches at the DAC output can be accurately scaled. In another exemplary DAC implementation, the compensated current cell is used to convert the entire digital value, and as a result, switching glitches at the DAC output can be significantly reduced or eliminated.

Figure 3:
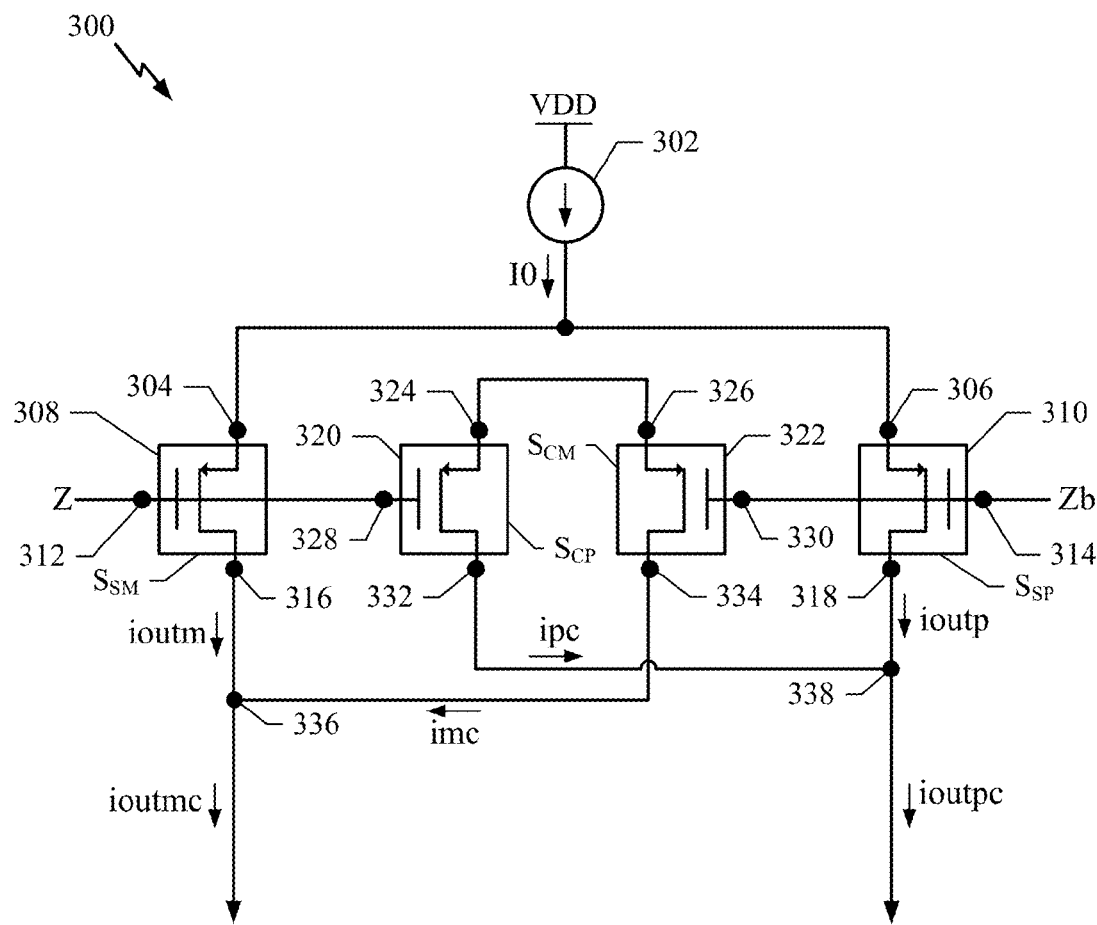
FIG. 3 shows an exemplary compensated current cell.

FIG. 3 shows an exemplary compensated current cell 300. For example, the compensated current cell 300 is suitable for use to scale, reduce or eliminate switching glitches in a current switching DAC.

The current cell 300 comprises a current source 302 connected to provide an input current I0 to source terminals 304 and 306 of differential PMOS transistor pair 308 and 310, respectively. The transistors 308 and 310 are connected to complementary input signals (Z and Zb) at their gate terminals 312 and 314, respectively. The input signals (Z and Zb) operate to switch the transistors 308 and 310 on and off so as to switch the input current I0 to drain terminals 316 and 318; thereby producing output currents ioutm and ioutp, respectively.

The current cell 300 also comprises compensation PMOS transistors 320 and 322. The compensation transistors 320 and 322 have their respective source terminals 324 and 326 connected together. The input signal Z is connected to gate terminal 328 of compensation transistor 320, and the input signal Zb is connected to gate terminal 330 of compensation transistor 322. The input signals (Z and Zb) operate to switch the compensation transistors 320 and 322 on and off to produce compensation currents ipc and imc at drain terminals 332 and 334, respectively. In an exemplary embodiment, all devices operate in triode mode.

The drain terminals 316 and 318 provide the output currents ioutm and ioutp, respectively. The compensation currents imc and ipc are coupled to the signal paths carrying the output currents ioutm and ioutp at terminals 336 and 338, respectively. Glitch scaling is provided when the compensation currents imc and ipc combine with the output currents ioutm and ioutp to produce compensated output currents ioutmc and ioutmp.

The compensation currents cancel out (or scale) a predetermined portion of the glitch that would normally appear in an uncompensated current cell, for instance, the uncompensated current cell 100 shown in FIG. 1. The scaling of the glitch is determined by the size difference between the current switches 308 and 310 and their associated compensation devices 322 and 320. For example, the current switch 308 has device size $S_{SM}$ and the current switch 310 has device size $S_{SP}$. In addition, the compensation device 320 has device size $S_{CP}$ and the compensation device 322 has device size $S_{CM}$. Thus, the difference in size between ($S_{SM}$ and $S_{CM}$) and ($S_{SP}$ and $S_{CP}$) determines the amount of glitch scaling. In one implementation, the difference in size between ($S_{SM}$ and $S_{CM}$) is the same as the difference in size between ($S_{SP}$ and $S_{CP}$). However, in other implementations, these size differences may not be identical.

Assuming the channel lengths of the switching (308, 310) and compensation (320, 322) devices are the same, the size difference is determined by the difference in channel widths (W0) between the devices. A more detailed description of how the size difference between the current switches devices and their associated compensation devices is adjusted for glitch scaling is provided below.

Figure 4:
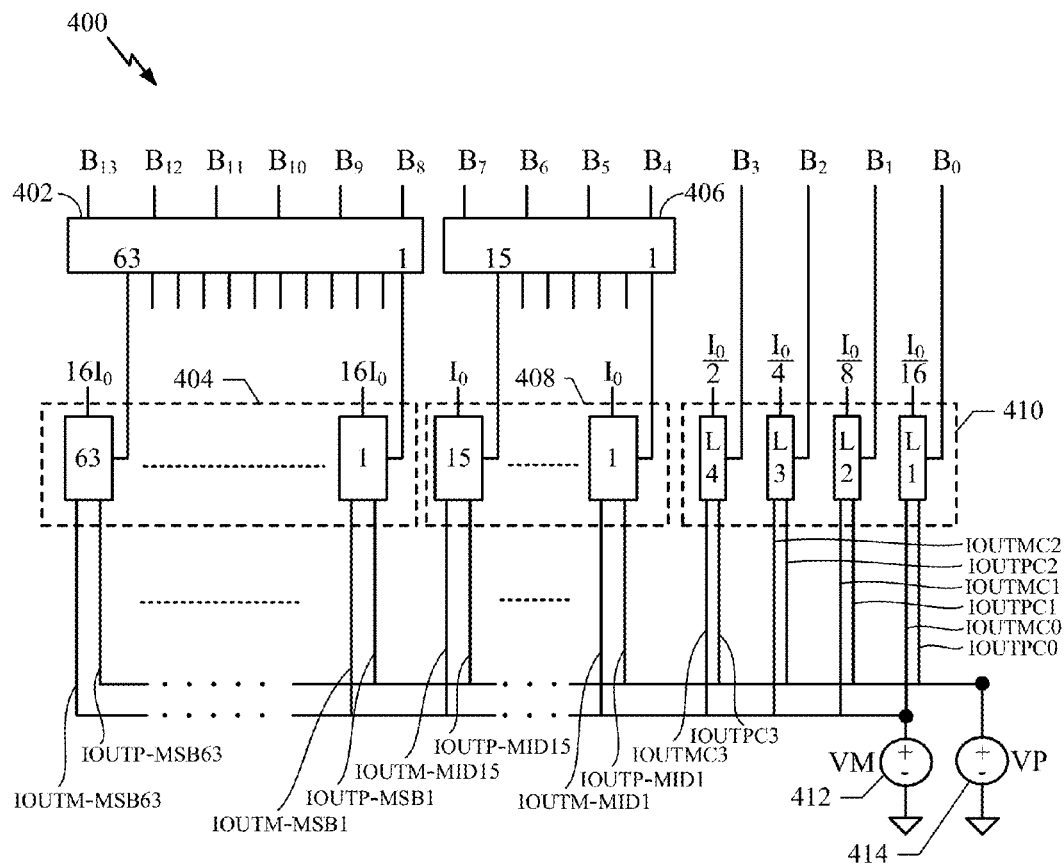
FIG. 4 shows an exemplary segmented current steering DAC comprising the compensated current cell shown in FIG. 3.

FIG. 4 shows an exemplary segmented current steering DAC 400 comprising the compensated current cell 300 shown in FIG. 3. For example, the compensated current cell 300 is configured to generate compensated output currents for each of the four least significant bits (LSBs) of the DAC 400. In this example, the DAC 400 is configured to convert a 14-bit digital value to an output current that is then converted to an analog voltage.

In DAC architectures, the current produced by the current cells are scaled using various techniques. For example, in a conventional 14-bit DAC, the ratio of the current associated with the MSB current cell to the current associated with the LSB current cell is $2^{14}:1$ or 16384:1. Such a high ratio may be difficult to implement accurately, therefore, segmented architectures are frequently used in DAC designs. In this exemplary implementation, a segmented architecture is used to set the ratio between the largest and smallest currents switched by the current cells of the DAC 400 to 256:1.

The DAC 400 has a segmented architecture that comprises a first thermometer decoder 402 that is configured for (6 to 63) decoding. The decoder 402 is connected to the most significant six bits ($B_8$-$B_{13}$) of the 14-bit value to be converted, and decodes these bits to 63 signals that are connected to 63 uncompensated current cells 404 in an MSB portion of the DAC 400. The 63 signals comprise differential signals that are connected to the inputs of the uncompensated current cells 404. Each of the uncompensated current cells 404 switches current having a level of (16*I0). For example, in one exemplary implementation, each of the uncompensated current cells comprises 16 switching devices connected together in parallel with each device switching a current level of I0 to produce the positive current output (ioutp) equal to (16*I0), and 16 switching devices connected together in parallel with each switching device switching a current level of I0 to produce the negative output current (ioutm) equal to (16*I0).

The DAC 400 also comprises a second thermometer decoder 406 that is configured for (4 to 15) decoding. The decoder 406 is connected to the middle significant four bits ($B_4$-$B_7$) of the 14-bit value to be converted, and decodes these bits to 15 signals that are connected to 15 uncompensated current cells 408 in a MID portion of the DAC 400. The 15 signals comprise differential signals that are connected to the inputs of the uncompensated current cells 408. Each of the uncompensated current cells 408 switches current having a level of (I0). For example, in one exemplary implementation, each of the uncompensated current cells comprises 1 switching device switching a current level of I0 to produce the positive current output (ioutp) and 1 switching device switching a current level of I0 to produce the negative current output (ioutm).

The DAC 400 also comprises four binary weighted compensated current cells 410 that are connected to the least significant four bits ($B_0$-$B_3$) of the 14-bit value to be converted. For example, each of the compensated current cells 410 may be the compensated current cell 300 shown in FIG. 3. The bits ($B_0$-$B_3$) comprise differential input signals that are connected to the inputs of the compensated current cells 410 to produce a 4-bit binary weighted compensated current output in an LSB portion of the DAC 400. For example, each of the compensated current cells 410 switches current having a different scaled level of the current I0.

In this exemplary implementation, the compensated current cell L1 switches a current having a scaled level of (I0/16), the current cell L2, switches a current having a scaled level of (I0/8), the current cell L3 switches a current having a scaled level of (I0/4), and the current cell L4 switches a current having a scaled level of (I0/2). Therefore, a current cell in the MSB portion of the DAC 400 switches a current that is represented by (I0*16) and the LSB current cell switches a current represented by (I0/16), which provides a ratio of 256:1. However, the current associated with the most significant bit ($B_{13}$) is actually the sum of the currents output from 32 current cells in the MSB portion, which is equivalent to (512*I0).

During the digital to analog conversion, the 63 MSB cells 404 output 63 (IOUTM-MSB1 to IOUTM-MSB63) uncompensated minus currents and 63 (IOUTP-MSB1 to IOUTP-MSB63) uncompensated positive currents. The 15 MID cells 408 output 15 (IOUTM-MID1 to IOUTM-MID15) uncompensated minus currents and 15 (IOUTP-MID1 to IOUTP-MID15) uncompensated positive currents. The four LSB compensated current cells 410 output four (IOUTMC0 to IOUTMC3) compensated minus currents and four (IOUTPC0 to IOUTPC3) compensated positive currents. All of the positive and minus currents are connected to output devices 414 and 412, respectively, which represent low impedance sources. The current in VP and VM is then converted to output voltages, VOUTP and VOUTM, elsewhere in the DAC 400. Because the DAC 400 utilizes the compensated current cell 410 to convert the least significant four bits of the digital value, the DAC 400 operates to provide scaled switching glitches and improved performance.

Device Size Configuration

In an exemplary implementation, the MID current cells 408 use minimum sized PMOS devices for their differential current switches to switch the input current I0 as described above. Since the current cells of the MSB portion of the DAC switch current that is 16 times larger than I0, the current cells in the MSB portion of the DAC (i.e., current cells 404) each use 16 minimum sized PMOS devices connected together in parallel for their current switching components. The current switches in the LSB current cells cannot be scaled below the minimum sized PMOS device, however, each of the compensated current cells 410 uses the size difference between their switching devices and their compensation devices to scale the switching glitches associated with these LSB cells.

Figure 5:
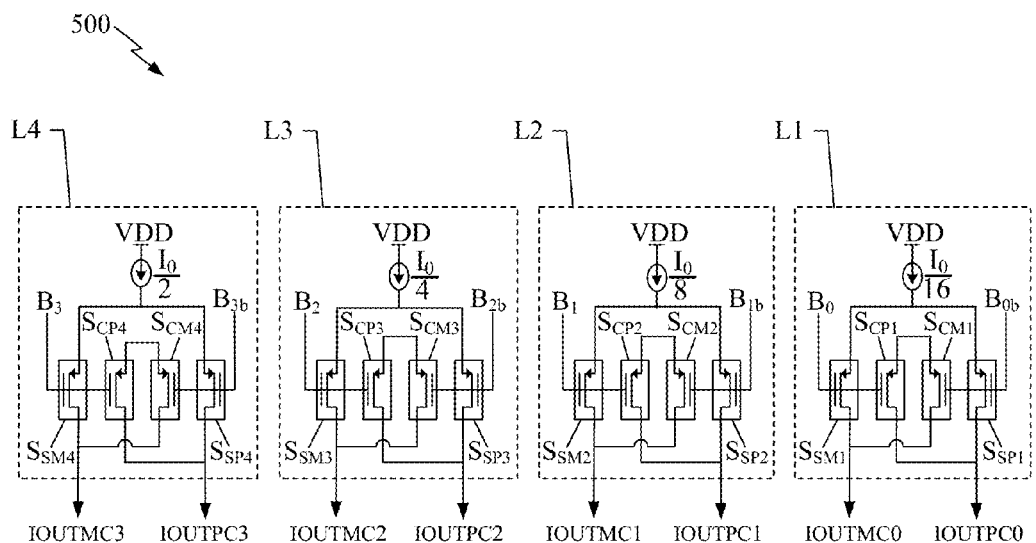
FIG. 5 shows four exemplary compensated current cells representing four least significant bits of the DAC shown in FIG. 4.

FIG. 5 shows four exemplary compensated current cells (L1-L4) used in the DAC 400 shown in FIG. 4. For example, each of the current cells (L1-L4) may be the current cell 300 shown in FIG. 3. The current cells (L1-L4) represent the LSB binary weighted current cells 410 used to convert the four least significant bits of the 14-bit digital value shown in FIG. 4.

The current cells (L1-L4) include switching devices and compensation devices that are appropriately sized to provide glitch scaling as described herein. In an exemplary implementation, device sizes are determined according to the following algorithm.

Current scale factor=[size of switching device−size of comp. device]

In one exemplary implementation, it is assumed that all the devices used in the DAC 400 have the same channel length. Thus, in this implementation, device sizing is achieved by adjusting the channel width (W0) of the switching and compensation devices. For example, it will be assumed that the channel width of the all the compensation devices is set to the minimum sized PMOS device having a width of 1. Thus, the channel widths for the switching devices can be determined using the above algorithm with the given scaled input currents.

As described below, only the size of the p-side switching device is determined, but it is assumed that the size m-side switching devices are identically sized.

For the compensated current cell L1 having its current scaled by (1/16), the p-side switching device width is $S_{SP1}$ and its compensation device width is $S_{CP1}$. According to the above algorithm, if the compensation device width $S_{CP1}$ is equal to 1, then the switching device width $S_{SP1}$ is determined as follows.

$(1/16)=0.0625=S_{SP1}-S_{CP1}$ $S_{SP1}=0.0625+1=1.0625$

For the compensated current cell L2 having its current scaled by (1/8), the p-side switching device width is $S_{SP2}$ and its compensation device width is $S_{CP2}$. According to the above algorithm, if the compensation device width $S_{CP2}$ is equal to 1, then the switching device width $S_{SP2}$ is determined as follows.

$(1/8)=0.125=S_{SP2}-S_{CP2}$ $S_{SP2}=0.125+1=1.125$

For the compensated current cell L3 having its current scaled by (1/4), the p-side switching device width is $S_{SP3}$ and its compensation device width is $S_{CP3}$. According to the above algorithm, if the compensation device width $S_{CP3}$ is equal to 1, then the switching device width $S_{SP3}$ is determined as follows.

$(1/4)=0.25=S_{SP3}-S_{CP3}$ $S_{SP3}=0.25+1=1.25$

For the compensated current cell L4 having its current scaled by (1/2), the p-side switching device width is $S_{SP4}$ and its compensation device width is $S_{CP4}$. According to the above algorithm, if the compensation device width $S_{CP4}$ is equal to 1, then the switching device width $S_{SP4}$ is determined as follows.

$(1/2)=0.5=S_{SP4}-S_{CP4}$ $S_{SP4}=0.5+1=1.5$

Thus, using the above algorithm device sizes for the switching and compensation devices of a compensated current cell can be determined to properly scale switching glitches.

DAC Glitch Reduction

In an exemplary implementation, the compensated current cell 300 can be configured to significantly reduce or eliminate switching glitches for the entire DAC. In this implementation, the size of the compensation device is set equal to the size of the corresponding switching device. For example, in the above algorithm, the current scale factor is set to zero, indicating that the size of the switching and compensation devices are the same.

In an exemplary implementation, a DAC can be configured with the compensated current cell to scale or reduce switching glitches for the entire DAC. In this implementation, all of the current cells of the DAC are implemented with the compensated current cell 300. This results in switching glitches being reduced throughout the DAC output range.

Figure 6:
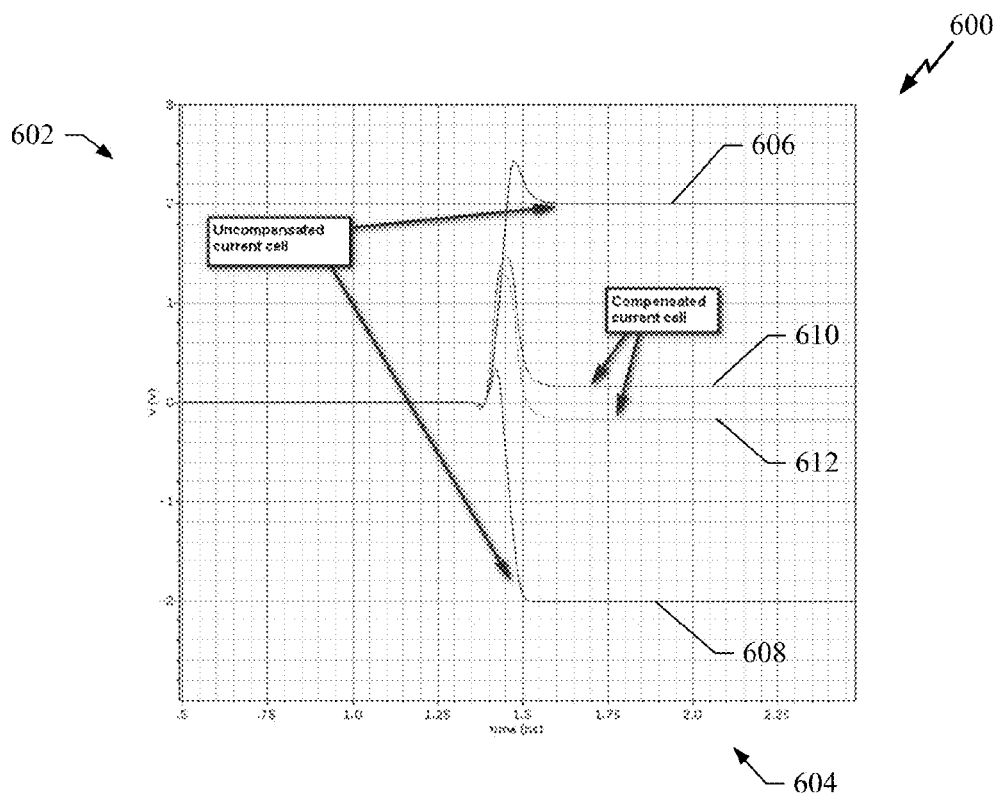
FIG. 6 shows an exemplary graph illustrating glitch reduction achieved with the compensated current cell shown in FIG. 3.

FIG. 6 shows an exemplary graph 600 illustrating glitch reduction achieved with the compensated current cell 300 shown in FIG. 3. For example, the graph 600 shows voltage (in volts) on a vertical axis 602 and time (in nanoseconds) on a horizontal axis 604. To generate the voltage waveforms shown in the graph 600, an uncompensated current cell (i.e., cell 100 shown in FIG. 1) is switched and the uncompensated current outputs (ioutp, ioutm) are converted to the voltage waveforms 606 and 608 shown on the graph 600. Next, a compensated current cell (i.e., cell 300 shown in FIG. 3) is switched and the compensated current outputs (ioutpc and ioutmc) are converted to the voltage waveforms 610 and 612 shown on the graph 600. In the conversion to voltage, one LSB is equivalent to one volt.

As can be seen in the graph 600, the scaled glitch (610, 612) associated with the compensated current cell is much smaller than the glitch (606, 608) associated with the uncompensated current cell. For example, in the uncompensated current cell, the glitch mismatch introduces plus and minus 2 volts=2 LSB's of error. In the compensated current cell, the error is reduced to plus and minus 0.16 volts=0.16 LSB's of error.

Figure 7:
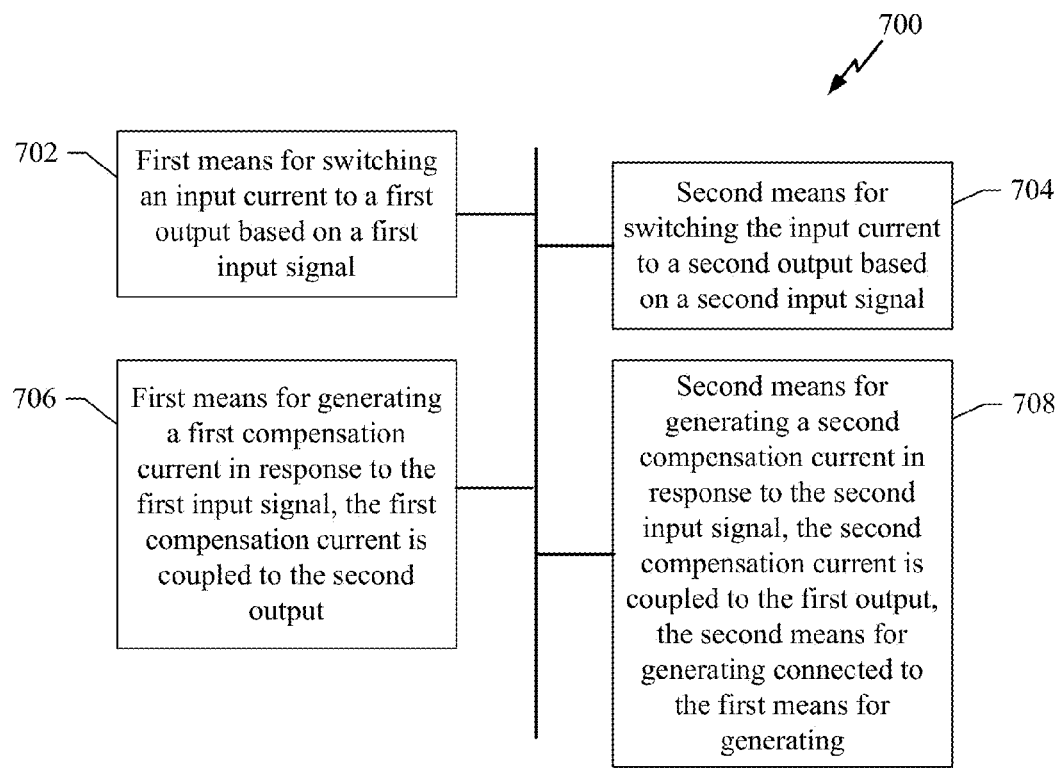
FIG. 7 shows an exemplary compensated current cell apparatus.

FIG. 7 shows an exemplary compensated current cell apparatus 700. The apparatus 700 is suitable for use as the compensated current cell 300 shown in FIG. 3. In an aspect, the apparatus 700 is implemented by one or more modules configured to provide the functions as described herein. For example, in an aspect, each module comprises discrete components, hardware modules, and/or hardware executing software.

The apparatus 700 comprises a first module comprising a first means (702) for switching an input current to a first output based on a first input signal, which in an aspect comprises device 308.

The apparatus 700 comprises a second module comprising a second means (704) for switching the input current to a second output based on a second input signal, which in an aspect comprises device 310.

The apparatus 700 also comprises a third module comprising a first means (706) for generating a first compensation current in response to the first input signal, the first compensation current is coupled to the second output, which in an aspect comprises device 320.

The apparatus 700 also comprises a fourth module comprising a second means (708) for generating a second compensation current in response to the second input signal, the second compensation current is coupled to the first output, the second means for generating connected to the first means for generating, which in an aspect comprises device 322.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the circuits disclosed herein may be realized using a variety of transistor types and technologies and are not limited to those transistor types and technologies illustrated in the Drawings.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. A compensated current cell, the cell comprising:
   first and second switching transistors configured to switch an input current between first and second outputs based on first and second input signals, respectively;
   a first compensation transistor connected to the first input signal to provide a first compensation current that is connected to the second output, the first compensation current based on the second input signal; and
   a second compensation transistor connected to the second input signal to provide a second compensation current that is connected to the first output, the second compensation current based on the first signal, the first and second compensation transistors having source terminals that are connected together.

2. The cell of claim 1, the first and second switching transistors and the first and second compensation transistors are MOS transistors.

3. The cell of claim 1, the first compensation current configured to scale glitches on second output and the second compensation current configured to scale glitches on first output.

4. The cell of claim 3, the glitches on the first output are scaled based on a size difference between the first switching transistor and the second compensation transistor.

5. The cell of claim 4, the size difference between the first switching transistor and the second compensation transistor is set equal to a current scaling factor.

6. The cell of claim 5, the current scaling factor is set to zero to reduce the glitches on the first output.

7. The cell of claim 3, the glitches on the second output are scaled based on a size difference between the second switching transistor and the first compensation transistor.

8. The cell of claim 7, the size difference between the second switching transistor and the first compensation transistor is set equal to a current scaling factor.

9. The cell of claim 8, the current scaling factor is set to zero to reduce the glitches on the second output.

10. A compensated current cell, the cell comprising:
    first means for switching an input current to a first output based on a first input signal;
    second means for switching the input current to a second output based on a second input signal;
    first means for generating a first compensation current in response to the first input signal, the first compensation current is coupled to the second output, the first compensation current based on the second input signal; and
    second means for generating a second compensation current in response to the second input signal, the second compensation current is coupled to the first output, the second compensation current based on the first input signal, the second means for generating connected to the first means for generating.

11. The cell of claim 10, the first compensation current is configured to scale glitches on the second output and the second compensation current is configured to scale glitches on the first output.

12. The cell of claim 11, the glitches on the first output are scaled based on a first size difference between the first means for switching and the second means for generating and the glitches on the second output are scaled based on a second size difference between the second means for switching and the first means for generating.

13. The cell of claim 12, the first size difference and the second size difference are set equal to a current scaling factor.

14. The cell of claim 13, the current scaling factor is set to zero to reduce the glitches on the first and second outputs.

15. A digital to analog convertor (DAC), comprising:
    at least one compensated current cells configured to receive a digital input and generate a current output, each compensated current cell comprising:
    first and second switching transistors configured to switch an input current between first and second outputs based on first and second input signals, respectively;
    a first compensation transistor connected to the first input signal to provide a first compensation current that is connected to the second output; and
    a second compensation transistor connected to the second input signal to provide a second compensation current that is connected to the first output, the first and second compensation transistors having source terminals that are connected together.

16. The cell of claim 15, the first and second switching transistors and the first and second compensation transistors are MOS transistors.

17. The DAC of claim 15, glitches on the first output are scaled based on a first size difference between the first switching transistor and the second compensation transistor and glitches on the second output are scaled based on a second size difference between the second switching transistor and the first compensation transistor.

18. The DAC of claim 16, the first size difference and the second size difference are set equal to a current scaling factor.

19. The DAC of claim 17, the current scaling factor is set to scale the glitches on the first and second output.

20. The DAC of claim 19, the current scaling factor is set to zero to reduce the glitches on the first and second output.

* * * * *